United States Patent [19]
Sako

[11] Patent Number: 6,104,199
[45] Date of Patent: Aug. 15, 2000

[54] MAGNETIC-HEAD SHORT-CIRCUIT DETECTOR

[75] Inventor: Michiya Sako, Kagoshima, Japan

[73] Assignee: Sony Corporation, Tokyo, Japan

[21] Appl. No.: 09/181,805

[22] Filed: Oct. 29, 1998

[30] Foreign Application Priority Data

Oct. 30, 1997 [JP] Japan ................................ P09-298689

[51] Int. Cl.$^7$ ................................................. G01R 31/02
[52] U.S. Cl. ........................................... 324/546; 324/210
[58] Field of Search ..................... 324/537, 546, 324/547, 210, 211

[56] References Cited

U.S. PATENT DOCUMENTS 4,746,869  5/1988  Schrag et al. ........................... 342/546
5,457,391  10/1995 Shimizu et al. ......................... 324/546
5,592,097  1/1997  Shimizu et al. ......................... 324/546

Primary Examiner—Josie Ballato
Assistant Examiner—Vincent Q. Nguyen
Attorney, Agent, or Firm—Ronald P. Kananen; Rader, Fishman & Grauer

[57] ABSTRACT

A magnetic-head short-circuit detector for correctly detecting an electrical short-circuit between coil terminals of a magnetic head. Terminals $H_X$ and $H_Y$ of the magnetic head are connected to the bases of a pnp-transistors $P_1$ and $P_2$ respectively. Current sources $I_1$ and $I_2$ are inserted between power supply $V_{CC}$ and the emitters of the transistors $P_1$ and $P_2$ respectively. The emitter of the transistor $P_1$ is connected to the (−) input terminal of a comparator 1 through a resistor $R_1$ and directly to the (+) input terminal of a comparator 2. The emitter of the transistor $P_2$ is connected to the (+) input terminal of the comparator 1 through a resistor $R_2$ and directly to the (−) input terminal of the comparator 2. A current source $I_3$ is connected between the (−) input terminal of the comparator 1 and GND. A current source $I_4$ is connected between the (input terminal of the comparator 2 and GND. Based on results of the comparison by the comparator 1 and the comparator 2, a short-circuit on the magnetic head is detected.

10 Claims, 6 Drawing Sheets

MAGNETIC-HEAD SHORT-CIRCUIT DETECTOR

FIELD OF THE INVENTION

The present invention generally relates to a magnetic head and, more particularly, to a magnetic-head short-circuit detector for correctly detecting an electrical short-circuit between coil terminals of a magnetic head.

BACKGROUND OF THE INVENTION

The following describes a related-art technology associated with the present invention with reference to FIGS. 4 through 7. FIG. 4 shows the record driving circuit of a magnetic head. FIG. 5 shows the waveforms of the voltages and data at both output ends when the magnetic head is normally operating. FIG. 6 shows a related-art magnetic-head short-circuit detector. FIG. 7 is a diagram for describing the detection of head short-circuit.

First, driving of the magnetic head of a HDD (Hard Disk Drive) for example will be described. As shown in FIG. 4, a transistor $Q_1$ is connected at the emitter thereof to a transistor $Q_3$ at the collector thereof and a transistor $Q_2$ is connected at the emitter thereof to a transistor $Q_4$ at the collector thereof. The collectors of the transistors $Q_1$ and $Q_2$ are connected to a power supply $V_{CC}$ and the emitters of the transistors $Q_3$ and $Q_4$ are grounded through a current source $I_w$. In such a circuit constitution, both ends $H_X$ and $H_Y$ of the coil of the magnetic head are connected to the connection point between the transistors $Q_1$ and $Q_3$ and to the connection point between the transistors $Q_2$ and $Q_4$ respectively. It should be noted that $L_H$ denotes magnetic-head inductance and $R_L$ denotes magnetic-head resistance.

In the above-mentioned circuit constitution, the transistors $Q_1$ through $Q_4$ are controlled in switching based on write data to apply an electric current to the magnetic-head coil, thereby generating a recording field to record data onto a magnetic recording medium. Namely, turning on the transistors $Q_1$ and $Q_4$ when the data with go to a logic high level (hereafter referred to as HIGH) and turning off the transistors $Q_2$ and $Q_3$ when the data go to a logic low level (hereafter referred to as LOW) cause current $i_{W1}$ to flow. On the other hand, turning on the transistors $Q_2$ and $Q_3$ when the data goes HIGH and turning off the transistors $Q_1$ and $Q_4$ when the data goes LOW cause current $i_{W2}$ to flow, generating an inverted field for magnetic recording. It should be noted here that $i_{W1}$ and $i_{W2}$ are derived from the current source $I_W$ and take a same value and $V_2$ represents a potential difference between the magnetic head terminals $H_X$ and $H_Y$ and has a relation of $V_2 = i_{W1} R_L = i_{W2} R_L$.

FIG. 5 shows the waveforms of write data (WD), voltages $V(H_X)$ and $V(H_Y)$ at the terminals $H_X$ and $H_Y$, and charge voltages $V(TP_{11})$ and $V(TP_{12})$ at test points $TP_{11}$ and $TP_{12}$ in the conventional magnetic-head short-circuit detector to be described with reference to FIG. 6.

When the write data is HIGH, the voltage $V(H_X)$ at the terminal $H_X$ becomes $V_{CC} - V_{BE}$, namely a voltage obtained by subtracting a voltage drop due to the transistor $Q_1$ shown in FIG. 4 from the supply voltage $V_{CC}$ and the voltage $V(H_Y)$ at the terminal $H_Y$ becomes $V_{CC} - V_{BE} - V_2$, namely a voltage obtained by further subtracting a voltage drop $V_2$ due to the current $i_{W1}$ from the above-obtained voltage $V_{CC} - V_{BE}$. Likewise, when the write data is LOW, the voltage $V(H_Y)$ at the terminal $H_Y$ becomes $V_{CC} - V_{BE}$, namely a voltage obtained by subtracting a voltage drop due to the transistor $Q_2$ shown in FIG. 4 from the supply voltage $V_{CC}$ and the voltage $V(H_X)$ at the terminal $H_X$ becomes $V_{CC} - V_{BE} - V_2$, namely a voltage obtained by further subtracting a voltage drop $V_2$ due to the current $i_{W2}$ from the above-obtained voltage $V_{CC} - V_{BE}$. It should be noted that a flyback pulse is caused due to a current component that rushes into the magnetic-head inductance LH at switching of each transistor.

In such a recording operation as described above, various monitoring capabilities for monitoring the states of the operation are required of the driving circuit, one of the capabilities being the detection of a short-circuit on a magnetic head. This capability outputs a signal indicative of an abnormal operation if the magnetic-head coil shorts for some reason.

FIG. 6 shows an example of a conventional magnetic-head short-circuit detector, also providing a frequency detecting capability. A terminal $H_X$ of the magnetic head is connected to the base of a pnp-transistor $P_1$. A current source $I_1$ is inserted between a power supply $V_{CC}$ and the emitter of the transistor $P_1$. This constitution charges a capacitor $C_1$. Likewise, a terminal $H_Y$ is connected to the base of a pnp-transistor $P_2$. A current source $I_2$ is inserted between the power supply $V_{CC}$ and the emitter of the transistor $P_2$. This constitution charges a capacitor $C_2$.

As shown in FIG. 5, the flyback pulses caused at the terminals $H_X$ and $H_Y$ at switching between HIGH and LOW of the write data operate the transistors $P_1$ and $P_2$ to discharge the capacitors $C_1$ and $C_2$, which are then charged again by current $i_1$ and $i_2$. Therefore, the charge voltage waveform of the capacitor $C_1$, namely the voltage waveform of the test point $TP_{11}$ is represented by $V(TP_{11})$ shown in FIG. 5 and the charge voltage waveform of the capacitor $C_2$, namely the voltage waveform at the test point $TP_{12}$ is represented by $V(TP_{12})$ shown in FIG. 5.

The voltage at this test point $TP_{11}$ is inputted in a comparator 1 and the voltage at the test point $TP_{12}$ is inputted in a comparator 2 to be compared with a common voltage $V_{TH} = V_{CC} - V_1$ that provides comparison reference. If, as shown in FIG. 7, flyback pulses are caused at period T for discharging, charging starts after a flyback pulse to supply charge from the current source $I_1$ to the capacitor $C_1$ and from the current source $I_2$ to the capacitor $C_2$, raising the voltage with time. In this state, when discharge is caused by a next flyback pulse before the charge voltage reaches $V_{TH}$, only LOWs are kept outputted from the comparators 1 and 2. Therefore, LOW is kept outputted from an OR gate 5, indicating a state in which no short-circuit is taking place on the magnetic head.

On the other hand, if a short-circuit is taking place on the magnetic head, the terminals $H_X$ and $H_Y$ both present the same potential as $V_{CC} - V_{BE}$ and are fixed thereto. In this state, the transistors $P_1$ and $P_2$ do not operate, while the capacitors $C_1$ and $C_2$ are kept charged to raise the voltages at the $TP_{11}$ and the $TP_{12}$, being held over the voltage $V_{TH}$. Consequently, HIGH is kept outputted from the comparators 1 and 2 and therefore HIGH is kept outputted from the OR gate 5, indicating a state in which a short-circuit is taking place on the magnetic head. It should be noted that a flip-flop 4 synchronizes with the write data WD to properly detect the output of the OR gate 5.

The magnetic-head short-circuit detector shown in FIG. 6 also provides a frequency detecting capability. To be more specific, if the period T of the write data WD slows to T+delta T as shown in FIG. 7, it takes longer for the capacitors $C_1$ and $C_2$ to be charged. Therefore, the capacitors $C_1$ and $C_2$ are charged beyond the comparison reference voltage $V_{TH}$. As a result, HIGHs are outputted from the comparators 1 and 2 for a time from $t_1$ at which the $V_{TH}$ has been exceeded to $t_2$ at which discharging is performed by flyback pulse, thereby indicating that the period of the write data WD is longer, or the frequency is lower.

Actually, however, mounting a magnetic head onto equipment requires signal input/output wiring, which inevitably causes an inductance component, thereby generating short flyback pulses. If these flyback pulses take place on the LOW side, they operate the transistors to periodically discharge the capacitors, possibly failing the detection of a head short-circuit.

It is therefore an object of the present invention to correctly detect an electric short-circuit between the terminals of a magnetic head by eliminating the influence of the inductance caused by circuit board wiring.

SUMMARY OF THE INVENTION

In carrying out the invention and according to one aspect thereof, there is provided a magnetic-head short-circuit detector comprising: first voltage and second voltage generating means for generating a first voltage corresponding to a voltage that appears at one end of a magnetic-head coil when a magnetic head is in a recording state and a second voltage having a predetermined potential difference relative to the first voltage; third voltage and fourth voltage generating means for generating a third voltage corresponding to a voltage that appears at another end of the magnetic-head coil when the magnetic head is in the recording state and a fourth voltage having a predetermined potential difference relative to the third voltage; first comparing means for comparing the first voltage with the fourth voltage; and second comparing means for comparing the second voltage with the third voltage; wherein a short circuit between both ends of the magnetic-head coil is detected based on a result of the comparison by the first comparing means and a result of the comparison of the second comparing means.

According to the above-mentioned circuit constitution, the voltage between the terminals of the magnetic-head coil is always monitored, thereby enabling the elimination of the influence of the inductance caused by circuit board to correctly detect an electrical short circuit between the terminals of the magnetic head.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENT

Figure 1:
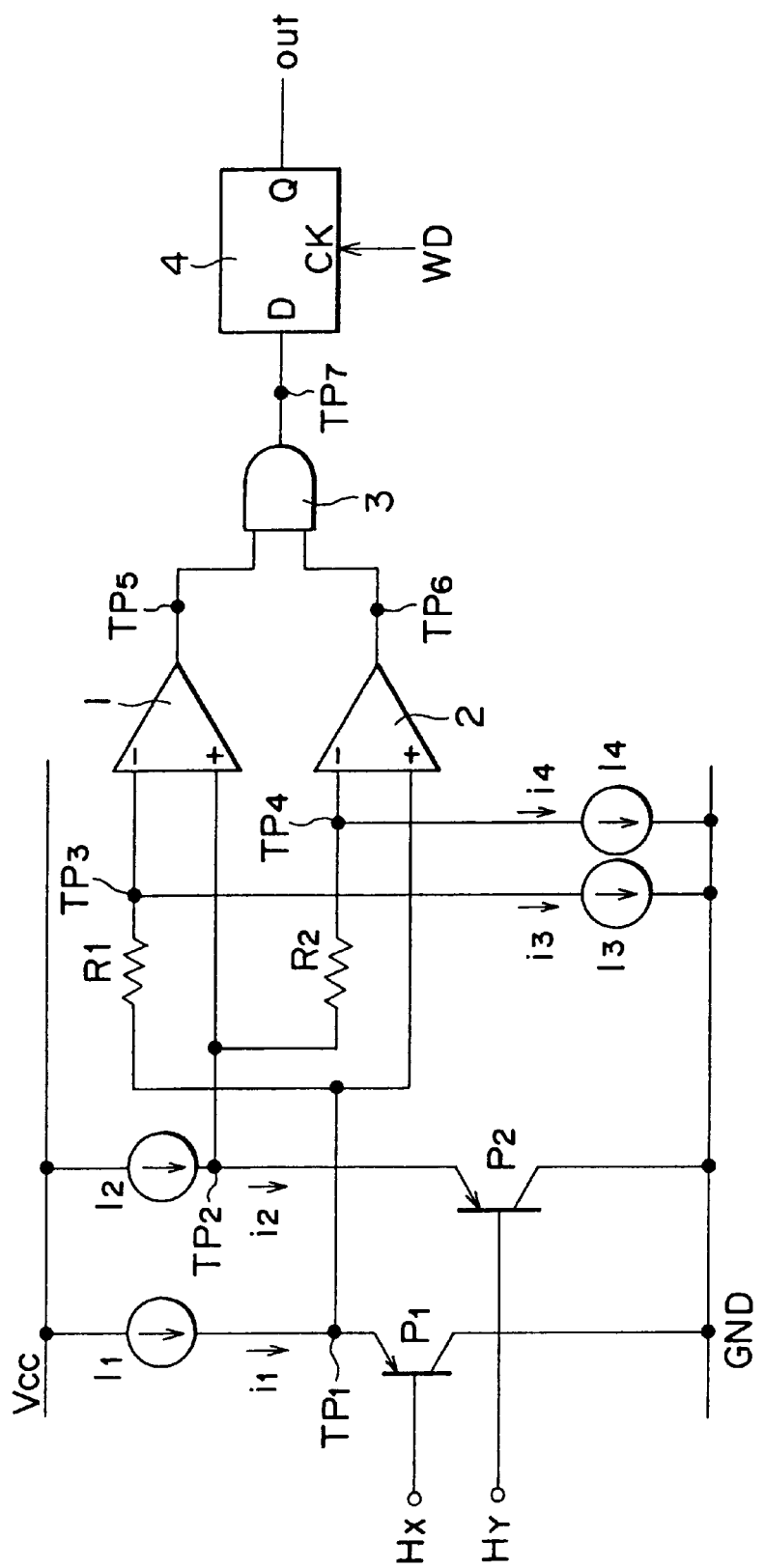
FIG. 1 is a circuit diagram illustrating a magnetic-head short-circuit detector practiced as one preferred embodiment of the invention.
Figure 2:
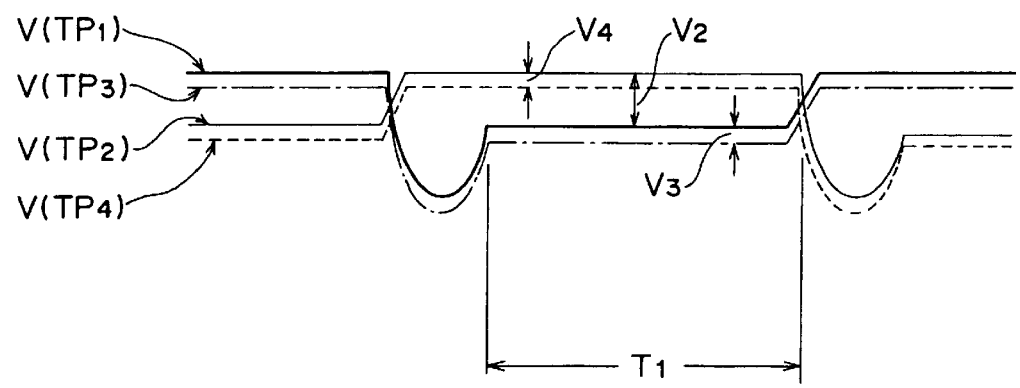
FIG. 2 is a diagram illustrating voltage waveforms observed at test points when the magnetic head of the above-mentioned preferred embodiment is operating normally.
Figure 3:
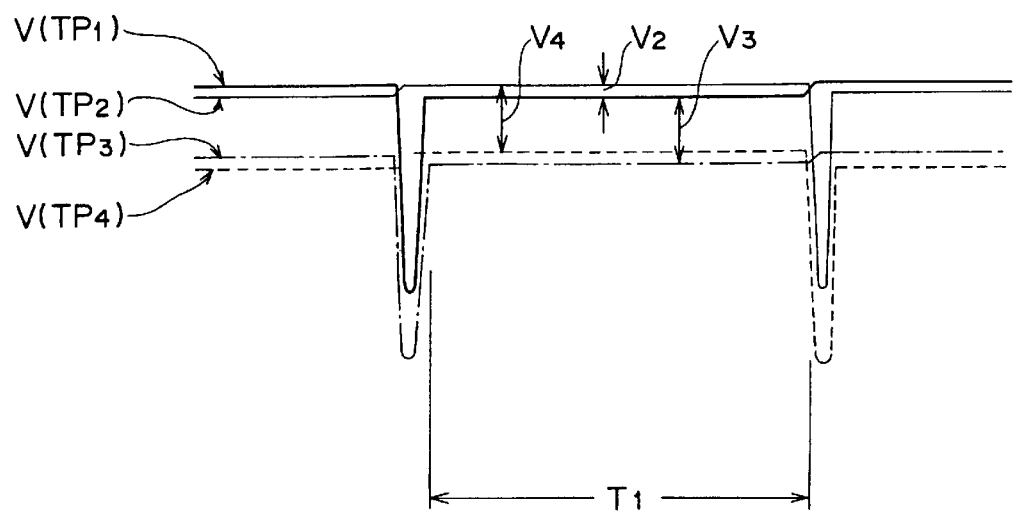
FIG. 3 is a diagram illustrating voltage waveforms observed at test points when the magnetic head of the above-mentioned preferred embodiment has a short circuit.

This invention will be described in further detail by way of example with reference to FIGS. 1 through 3. FIG. 1 shows a preferred embodiment of a magnetic-head short-circuit detector according to the present invention. FIG. 2 shows voltage waveforms observed at test points when the magnetic head of the preferred embodiment is operating normally. FIG. 3 shows voltage waveforms observed at test points when a short-circuit is taking place on the magnetic head. A recording driver for use in this magnetic head is generally the same as that shown in FIG. 4.

Figure 4:
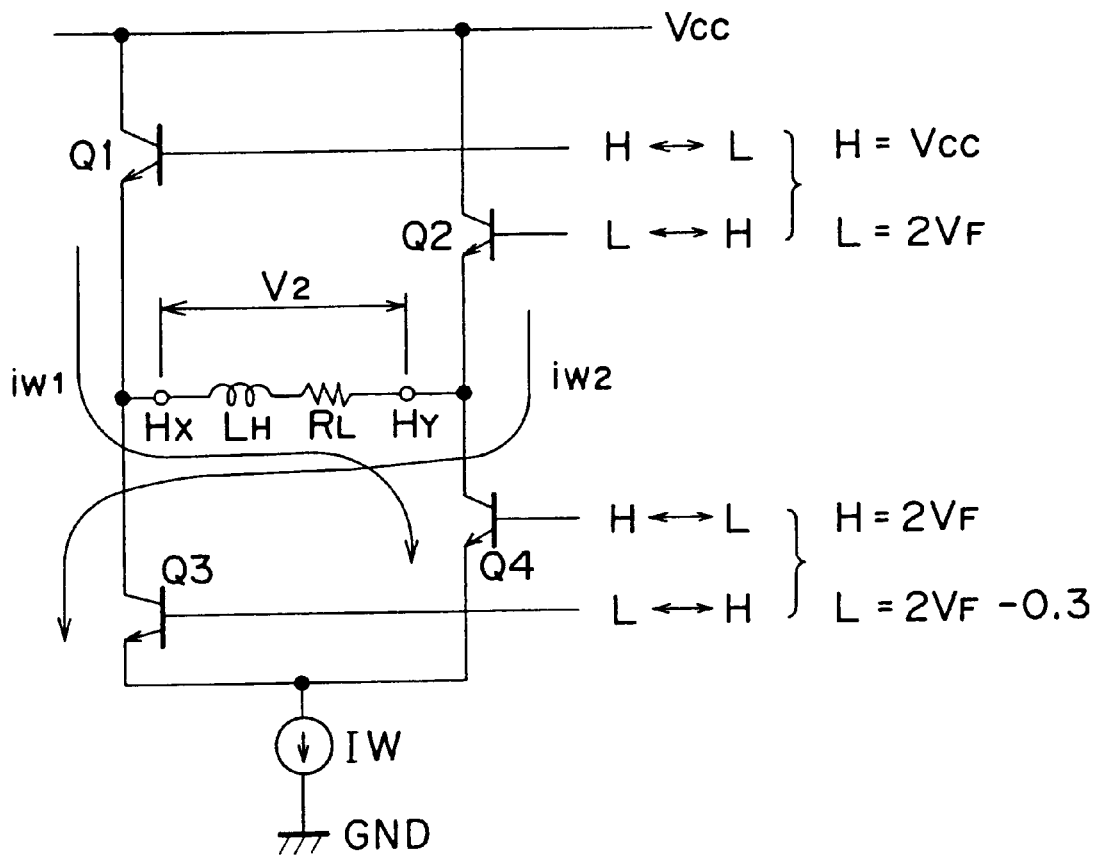
FIG. 4 is a circuit diagram illustrating a related art magnetic-head recording driver.
Figure 5:
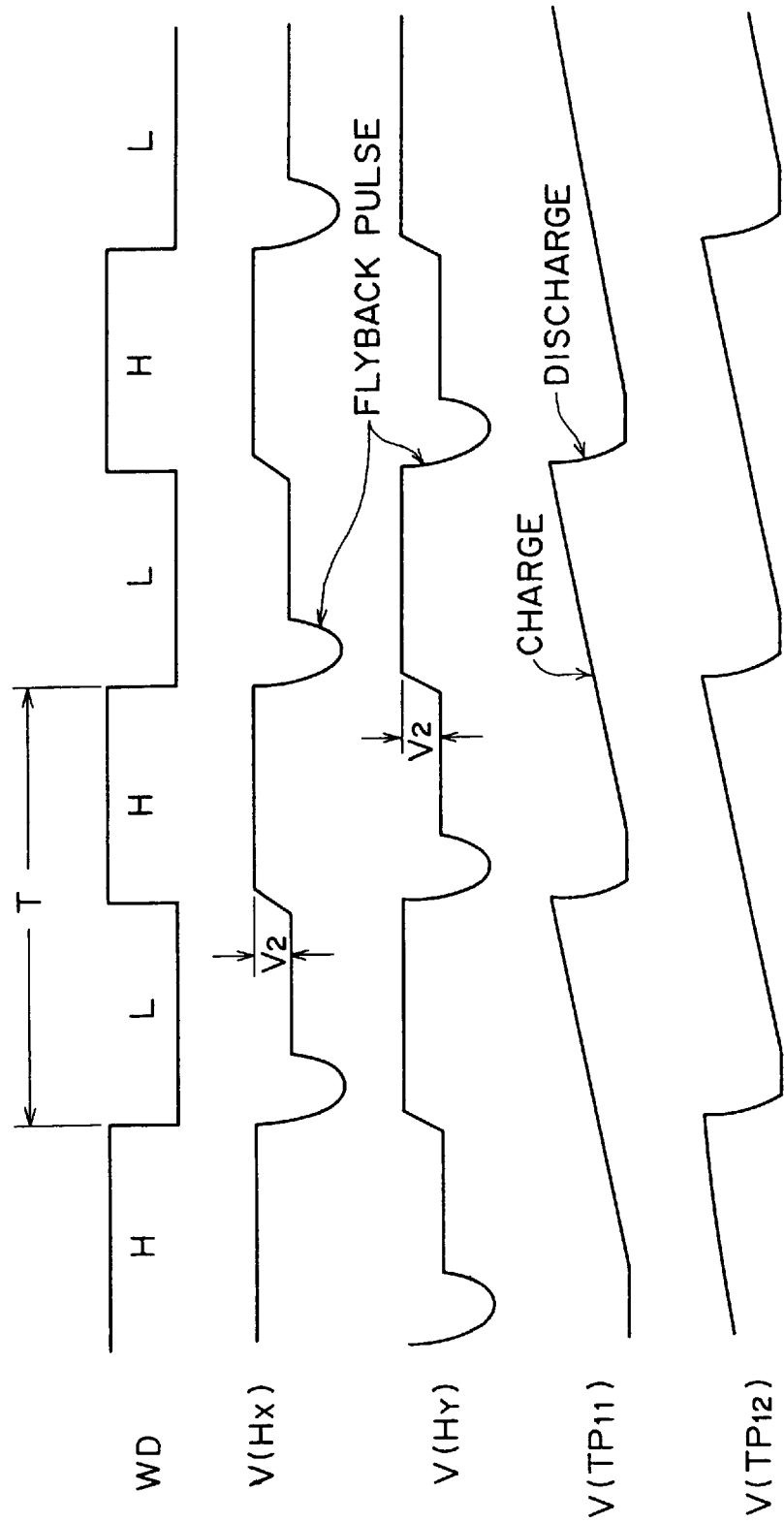
FIG. 5 is a diagram illustrating voltage and data waveforms observed at both output ends of the magnetic head when the same is operating normally.
Figure 6:
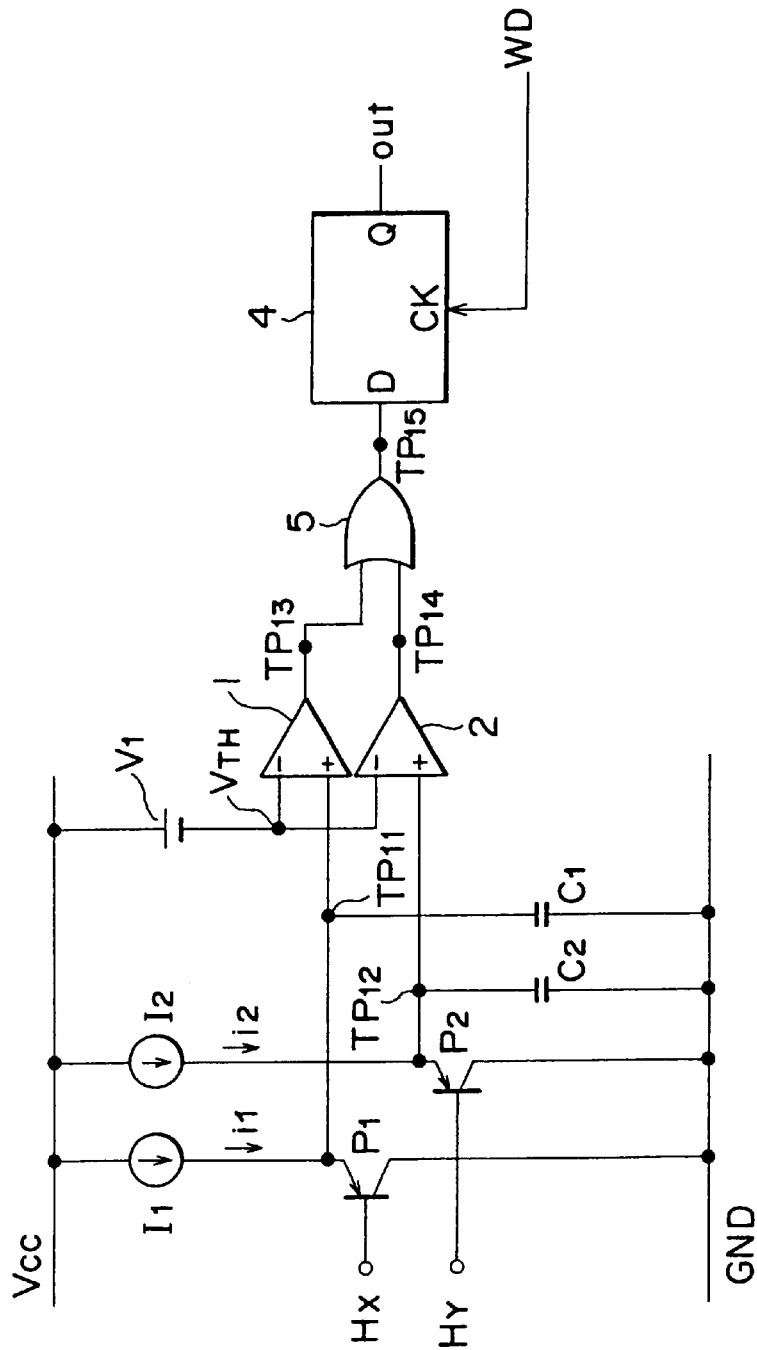
FIG. 6 is a circuit diagram illustrating a related-art magnetic-head short-circuit detector.
Figure 7:
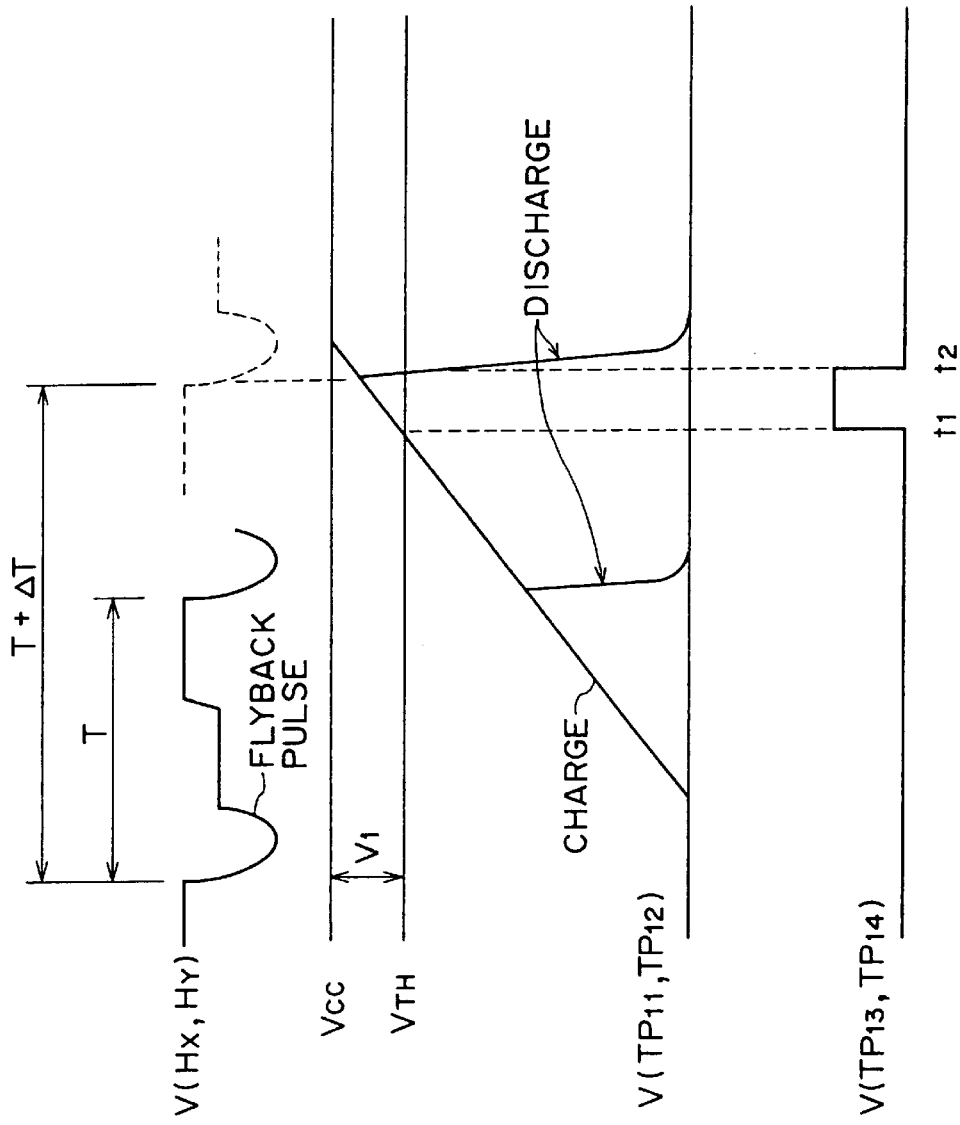
FIG. 7 is a diagram for describing the detection of a short circuit on the related-art magnetic head.

Now, referring to FIG. 1, the preferred embodiment of the invention is constituted that terminal $H_X$ of the magnetic head in the recording driver shown in FIG. 4 is connected to the base of a pnp-transistor $P_1$ and a current source $I_1$ is inserted between a power supply $V_{CC}$ and the emitter of the transistor $P_1$. Likewise, a terminal $H_Y$ is connected to the base of a pnp-transistor $P_2$ and a current source $I_2$ is inserted between the power supply $V_{CC}$ and the emitter of the transistor $P_2$. The emitter of the transistor $P_1$ is connected to the (−) input terminal of a comparator 1 through a resistor $R_1$, while the emitter of the transistor $P_1$ is directly connected to the (+) input terminal of the comparator 2. On the other hand, the emitter of the transistor $P_2$ is directly connected to the (+) input terminal of the transistor $P_2$, while the emitter of the transistor $P_2$ is connected to the (−) input terminal of a comparator 2 through a resistor $R_2$. A current source $I_3$ is connected between the (−) input terminal of the comparator 1 and ground (GND). A current source $I_4$ is connected between the (−) input terminal of the comparator 2 and ground (GND). The outputs of the comparators 1 and 2 are inputted in an AND gate 3, the output of which is inputted in a flip-flop 4.

The following describes operations of the above-mentioned magnetic-head short-circuit detector. First, when the magnetic head is operating normally, or operating without short circuit, a relationship between voltages at test points $TP_1$ through $TP_4$ shown in FIG. 1 is as shown in FIG. 2. To be more specific, when write data WD is LOW, a voltage $V(H_X)$ at the terminal $H_X$ becomes a voltage $V_{CC} - V_{BE} - V_2$ and a voltage $V(H_Y)$ at the terminal $H_Y$ becomes a voltage $V_{CC} - V_{BE}$ as described in the related-art example with reference to FIG. 4. Consequently, a potential difference between a voltage $V(TP_1)$ at the test point $TP_1$ and a voltage $V(TP_2)$ at the test point $TP_2$ becomes $V_2$. Further, a voltage $V(TP_3)$ at the test point $TP_3$ is $V(TP_1) - i_3 \times R_1$ and a voltage $V(TP_4)$ at the test point $TP_4$ is $V(TP_2) - i_4 \times R_2$. As shown in FIG. 2, $V_3 = i_3 \times R_1$ and $V_4 = i_4 \times R_2$. $V_2$ is a voltage drop due to a magnetic-head resistance $R_L$ and a recording current same as those described in the above-mentioned related-art example with reference to FIG. 4.

In the above-mentioned state, the resistors $R_1$ and $R_2$ and currents $i_3$ and $i_4$ can be specified so that a relation in magnitude between inputs $V(TP_2)$ and $V(TP_3)$ to the comparator 1 is always $V(TP_2) > V(TP_3)$ in period $T_1$ while a relation in magnitude between inputs $V(TP_1)$ and $V(TP_4)$ to the comparator 2 is always $V(TP_1) < V(TP_4)$ in period $T_1$. This turns HIGH the output $(TP_5)$ of the comparator 1 in period $T_1$ and LOW the output $(TP_6)$ of the comparator 2 in period $T_1$. Consequently, the output of the AND gate 3 is LOW $(TP_7)$, thereby indicating that no short-circuit is taking place on the magnetic head.

On the other hand, if a short circuit is taking place on the magnetic head and a flyback pulse is outputted due to wiring inductance, a relationship between voltages at the test points $TP_1$ through $TP_4$ is as shown in FIG. 3. To be more specific, the short circuit makes almost zero the difference $V_2$ between $V(TP_1)$ and $V(TP_2)$. When the write data WD is LOW, the voltage $V(TP_3)$ is a voltage $V(TP_1)-i_3 \times R_1$ and the voltage $V(TP_4)$ is a voltage $V(TP_2)-i_4 \times R_2$. It should be noted that the voltage axis direction is enlarged in FIG. 3 as compared with that in FIG. 2.

Comparison in magnitude between the inputs $V(TP_2)$ and $V(TP_3)$ to the comparator 1 in this state where this $V_2$ is almost zero indicates always $V(TP_2)>V(TP_3)$ in period $T_1$, the output of the comparator 1 going HIGH ($TP_5$). On the other hand, comparison in magnitude between the inputs $V(TP_1)$ and $V(TP_4)$ to the comparator 2 indicates always $V(TP_1)>V(TP_4)$ in period $T_1$, the output of the comparator 2 also going HIGH ($TP_6$). Consequently, the output of the AND gate 3 goes HIGH ($TP_7$), thereby indicating that a short circuit is taking place on the magnetic head.

Thus, the operations of the magnetic-head short-circuit detector that take place while the write data WD is LOW have been described. It will be apparent to those skilled in the art that like operations are also performed while the write data WD is HIGH. It should be noted that a flip-flop 4 is provided for stable detection of magnetic-head short-circuits by use of a sampling signal based on the write data WD.

It will be also apparent to those skilled in the art that the present invention is not limited to the above-mentioned preferred embodiment. Any other circuit constitutions may be used if they implement the technological concept of the present invention.

As described and according to the invention, the magnetic-head short-circuit detector described so far eliminates the influence of the inductance due to a circuit board to correctly detect an electrical short-circuit between the terminals of a magnetic head.

While the preferred embodiment of the present invention has been described using specific terms, such description is for illustrative purposes only, and it is to be understood that changes and variations may be made without departing from the spirit or scope of the appended claims.

What is claimed is:

1. A magnetic-head short-circuit detector comprising:
    first voltage and second voltage generating means for generating a first voltage corresponding to a voltage that appears at one end of a magnetic-head coil when a magnetic head is in a recording state and a second voltage having a predetermined potential difference relative to said first voltage;
    third voltage and fourth voltage generating means for generating a third voltage corresponding to a voltage that appears at another end of said magnetic-head coil when said magnetic head is in said recording state and a fourth voltage having a predetermined potential difference relative to said third voltage;
    first comparing means for comparing said first voltage with said fourth voltage; and
    second comparing means for comparing said second voltage with said third voltage;
    wherein a short circuit between both ends of said magnetic-head coil is detected based on a result of the comparison by said first comparing means and a result of the comparison of said second comparing means.

2. The magnetic-head short-circuit detector as claimed in claim 1, further comprising:
    conjunction means for obtaining conjunction between the result of the comparison by said first comparing means and the result of the comparison by said second comparing means;
    wherein, based on a result of said conjunction, a short-circuit between both ends of said magnetic-head coil is detected.

3. The magnetic-head short-circuit detector as claimed in claim 1, wherein said predetermined potential difference between said first voltage and said second voltage is set by a first resistor inserted between said first voltage and said second voltage and a first current source arranged so that current flows to said first resistor.

4. The magnetic-head short-circuit detector as claimed in claim 1, wherein said predetermined potential difference between said third voltage and said fourth voltage is set by a second resistor inserted between said third voltage and said fourth voltage and a second current source arranged so that current flows to said second resistor.

5. The magnetic head short-circuit detector as claimed in claim 2 further comprising:
    a flip-flop with an input connected to output of said conjunction means; and
    the clock of said flip-flop connected to a sampling signal, thereby resulting in stable detection of said gate's level.

6. A magnetic-head short-circuit detector comprising:
    first voltage and second voltage generators for generating a first voltage corresponding to a voltage that appears at one end of a magnetic-head coil when a magnetic head is in a recording state and a second voltage having a predetermined potential difference relative to said first voltage;
    third voltage and fourth voltage generators for generating a third voltage corresponding to a voltage that appears at another end of said magnetic-head coil when said magnetic head is in said recording state and a fourth voltage having a predetermined potential difference relative to said third voltage;
    first comparator for comparing said first voltage with said fourth voltage; and
    second comparator for comparing said second voltage with said third voltage;
    wherein a short circuit between both ends of said magnetic-head coil is detected based on a result of the comparison by said first and second comparators.

7. The magnetic head short-circuit detector as claimed in claim 6, further comprising:
    a gate which obtains conjunction between the result of the comparison by said first comparator and the result of the comparison by said second comparator means;
    wherein, based on a result of said conjunction, a short-circuit between both ends of said magnetic head coil is detected.

8. The magnetic head short-circuit detector as claimed in claim 6, wherein said predetermined potential difference between said first voltage and said second voltage is set by a first resistor inserted between said first voltage and said second voltage and a first current source arranged so that current flows to said first resistor.

9. The magnetic head short-circuit detector as claimed in claim 6, wherein said predetermined potential difference between said third voltage and said fourth voltage is set by a second resistor inserted between said third voltage and said fourth voltage and a second current source arranged so that current flows to said second resistor.

10. The magnetic head short-circuit detector as claimed in claim 7 further comprising a flip-flop, connected to output of said gate and also to a sampling signal, for stable detection of said gate's level.

* * * * *